United States Patent
Wu et al.

(10) Patent No.: US 10,707,411 B1
(45) Date of Patent: Jul. 7, 2020

(54) MRAM STRUCTURE FOR EFFICIENT MANUFACTURABILITY

(71) Applicant: Marvell International Ltd., Hamilton (BM)

(72) Inventors: Zining Wu, Los Altos, CA (US); Winston Lee, Palo Alto, CA (US); Runzi Chang, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 16/425,366

(22) Filed: May 29, 2019

Related U.S. Application Data (62) Division of application No. 15/185,812, filed on Jun. 17, 2016.

(60) Provisional application No. 62/181,940, filed on Jun. 19, 2015.

(51) Int. Cl.
| | |
|---|---|
| *H01L 43/08* | (2006.01) |
| *H01L 43/12* | (2006.01) |
| *H01L 43/02* | (2006.01) |
| *H01L 27/22* | (2006.01) |

(52) U.S. Cl.
CPC ............ *H01L 43/08* (2013.01); *H01L 27/228* (2013.01); *H01L 43/02* (2013.01); *H01L 43/12* (2013.01)

(58) Field of Classification Search
CPC ....... H01L 43/08; H01L 27/228; H01L 43/12; H01L 43/02
See application file for complete search history.

(56) References Cited

U.S. PATENT DOCUMENTS

| | | | |
|---|---|---|---|
| 9,618,441 B2 | 4/2017 | Greenberg | |
| 2007/0048950 A1 | 3/2007 | Kanakasabapathy | |
| 2009/0209050 A1* | 8/2009 | Wang | H01L 27/228 438/3 |
| 2013/0032775 A1 | 2/2013 | Satoh | |
| 2014/0281231 A1* | 9/2014 | Lee | H01L 43/02 711/118 |
| 2015/0249209 A1 | 9/2015 | Lu | |
| 2016/0359101 A1 | 12/2016 | Kuo | |

* cited by examiner

*Primary Examiner* — Jerome Leboeuf (57) ABSTRACT

A semiconductor device comprises a first conductive material, a contact, an a magnetic tunneling junction positioned between the first conductive material and the contact. The semiconductor device further comprises a spacer that is positioned between the first conductive material and the contact and surrounds at least a portion of the magnetic tunneling junction. The spacer comprises spacer material that has at least some etch selectivity compared to a dielectric material that surrounds at least a portion of the first conductive material.

9 Claims, 9 Drawing Sheets

902 FORM A SPACER SURROUNDING AT LEAST A PORTION OF A MAGNETIC TUNNELING JUNCTION BY DEPOSITING A SPACER MATERIAL TO AT LEAST A REGION OF A CONTACT THAT IS ADJACENT TO THE MAGNETIC TUNNELING JUNCTION

904 DEPOSIT A DIELECTRIC MATERIAL, WHEREIN THE SPACER MATERIAL HAS AT LEAST SOME ETCH SELECTIVITY COMPARED TO THE DIELECTRIC MATERIAL

906 REMOVE A PORTION OF THE DIELECTRIC MATERIAL THAT IS PROXIMATE TO THE MAGNETIC TUNNELING JUNCTION AND THE SPACER TO FORM A TRENCH

908 DEPOSIT A FIRST CONDUCTIVE MATERIAL INTO THE TRENCH

FIG. 9

MRAM STRUCTURE FOR EFFICIENT MANUFACTURABILITY

CROSS REFERENCE TO RELATED APPLICATIONS

This disclosure is a divisional of U.S. patent application Ser. No. 15/185,812, filed Jun. 17, 2016, which claims the benefit under 35 U.S.C. § 119(e) of U.S. Provisional Application No. 62/181,940, filed on Jun. 19, 2015, both of which are each hereby incorporated herein by reference in their entireties.

FIELD OF USE

This disclosure relates generally to improving manufacturability of a semiconductor device, and more particularly to providing protection of a magnetic tunneling junction in a magnetoresistive random-access memory (MRAM) cell structure.

BACKGROUND

MRAM is a type of non-volatile data storage technology. Unlike other forms of semiconductor memory devices that use electric charge or current flow to store information, MRAM uses magnetic elements to store information based on electron spin. The conventional MRAM structure typically includes an access transistor and an MRAM element, such as a magnetic tunneling junction. The magnetic tunneling junction includes a fixed magnetic layer, a thin tunnel barrier layer, and a storage magnetic layer. When a bias is applied to the magnetic tunneling junction, electrons tunnel through the thin tunnel barrier layer. The electrical resistance of the magnetic tunneling junction changes based on the relative orientation of the electron spin in the fixed and storage layers. In particular, the two layers having the same magnetization alignment causes the cell to have a low resistance, and an antiparallel alignment causes the cell to have a high resistance. Multiple MRAM cells can be arranged in a grid to produce high-density memory. MRAM technology offers several advantages over other forms of semiconductor memory devices, such as faster operation, low power consumption, and memory retention even with the power turned off.

SUMMARY

In view of the foregoing, systems and methods are provided for using and manufacturing a semiconductor device.

According to one aspect of the disclosure, a semiconductor device comprises a first conductive material, a contact, and a magnetic tunneling junction positioned between the first conductive material and the contact. The semiconductor device further comprises a spacer that is positioned between the first conductive material and the contact and surrounds at least a portion of the magnetic tunneling junction. The spacer comprises spacer material that has at least some etch selectivity compared to a dielectric material that surrounds at least a portion of the first conductive material.

In some implementations, the semiconductor device further comprises an etch stop material deposited adjacent to the spacer. A loading effect may cause a portion of the etch stop material that is adjacent to the spacer to remain. The etch stop material may have at least some etch selectivity compared to the dielectric material and at least some etch selectivity compared to the spacer material. The etch stop material may comprise silicon carbon nitride.

In some implementations, the dielectric material comprises silicon dioxide, and the spacer material comprises silicon nitride.

In some implementations, the spacer surrounds portions of sidewalls of the magnetic tunneling junction.

In some implementations, a first portion of the spacer that is proximate to a fixed layer of the magnetic tunneling junction is thicker than a second portion of the spacer that is proximate to a storage layer of the magnetic tunneling junction. A surface of the storage layer may contact the first conductive material. A surface of the fixed layer may contact the contact.

According to one aspect of the disclosure, a method of manufacturing a semiconductor device is described. The method comprises forming a spacer surrounding at least a portion of a magnetic tunneling junction by depositing a spacer material to at least a region of a contact that is adjacent to the magnetic tunneling junction, and depositing a dielectric material. The spacer material has at least some etch selectivity compared to the dielectric material. The method further comprises removing a portion of the dielectric material that is proximate to the magnetic tunneling junction and the spacer to form a trench, and depositing a first conductive material into the trench.

In some implementations, the method further comprises depositing an etch stop material after forming the spacer and before depositing the dielectric material. A loading effect may cause a portion of the etch stop material that is adjacent to the spacer to remain after a portion of the etch stop material is removed. The etch stop material may have at least some etch selectivity compared to the dielectric material and at least some etch selectivity compared to the spacer material. The etch stop material may comprise silicon carbon nitride.

In some implementations, the dielectric material comprises silicon dioxide, and the spacer material comprises silicon nitride.

In some implementations, the spacer surrounds portions of sidewalls of the magnetic tunneling junction.

In some implementations, a first portion of the spacer that is proximate to a fixed layer of the magnetic tunneling junction is thicker than a second portion of the spacer that is proximate to a storage layer of the magnetic tunneling junction. A surface of the storage layer may contact the first conductive material. A surface of the fixed layer may contact the contact.

BRIEF DESCRIPTION OF THE DRAWINGS

The above and other features of the present disclosure, including its nature and its various advantages, will be more apparent upon consideration of the following detailed description, taken in conjunction with the accompanying drawings in which.

DETAILED DESCRIPTION

This disclosure generally relates to improving manufacturability of a semiconductor device, as well as providing protection of a magnetic tunneling junction in an MRAM cell structure. To provide an overall understanding of the disclosure, certain illustrative embodiments will now be described, including an MRAM cell that has a protective spacer material surrounding a portion of a magnetic tunneling junction. However, it will be understood by one of ordinary skill in the art that the systems and methods described herein may be adapted and modified as is appropriate for the application being addressed, and that the systems and methods described herein may be employed in other suitable applications, and that such other additions and modifications will not depart from the scope thereof.

Figure 1:
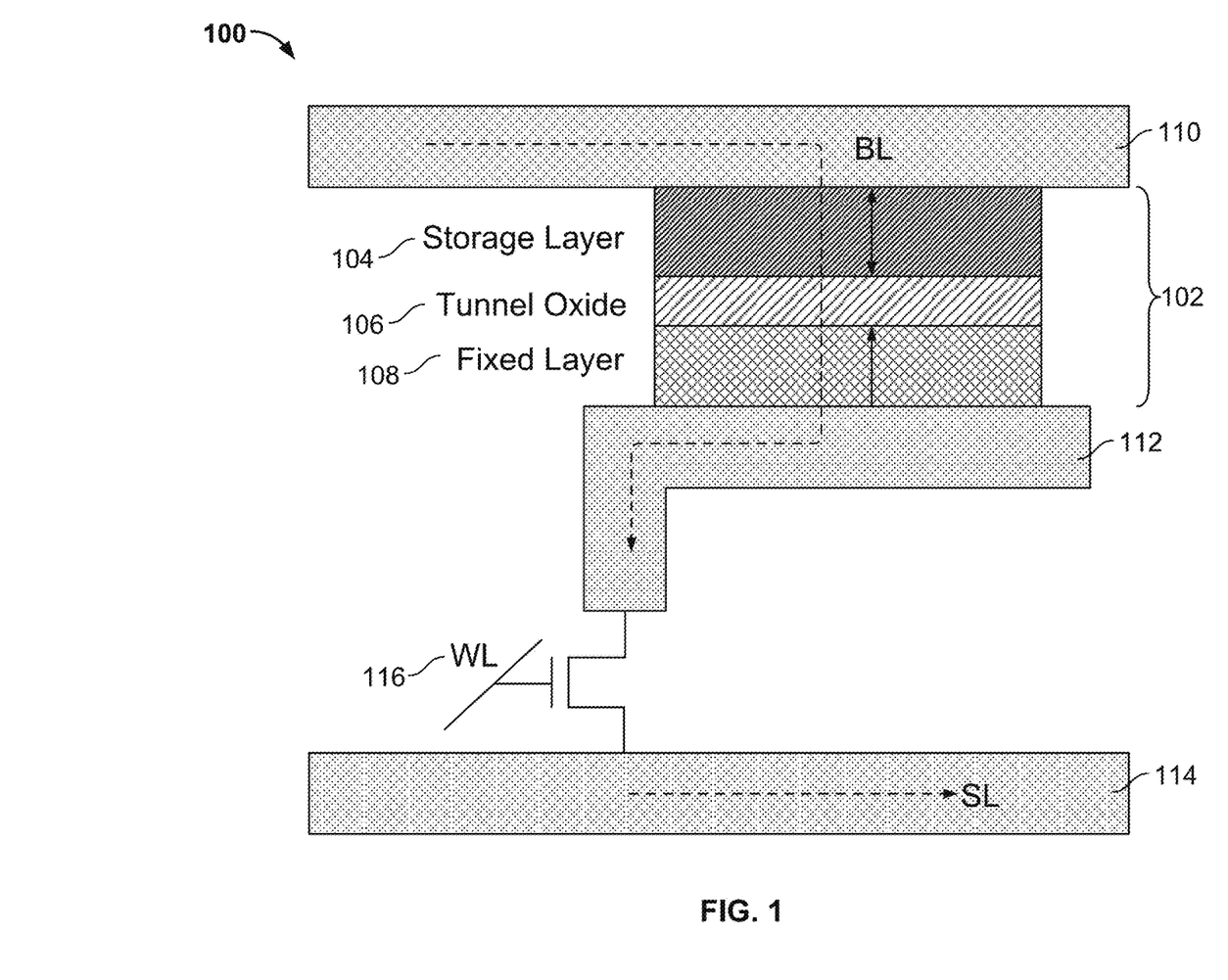
FIG. 1 is a diagram of an illustrative structure of an MRAM cell, in accordance with the prior art.

FIG. 1 shows an illustrative structure of an MRAM cell 100, in accordance with the prior art. The prior art MRAM cell 100 includes a magnetic tunneling junction 102 flanked by a bit line 110 on top and a source or drain contact 112 on bottom. The magnetic tunneling junction 102 includes a storage layer 104, a tunnel oxide layer 106, and a fixed layer 108. The source or drain contact 112 connects with a word line 116, which is coupled to a select line 114. As is shown in the prior art MRAM cell 100, a top surface of the storage layer 104 is coupled to a bottom surface of the bit line 110, and a bottom surface of the fixed layer 108 is coupled to a top surface of the source or drain contact 112. As indicated by the dotted arrows, current may flow from the bit line 110 down through the magnetic tunneling junction 102 and finally along the select line. Alternatively, current may flow in the opposite direction shown by the dotted arrows, from the select line up through the magnetic tunneling junction 102 and finally along the bit line 110.

Figure 2:
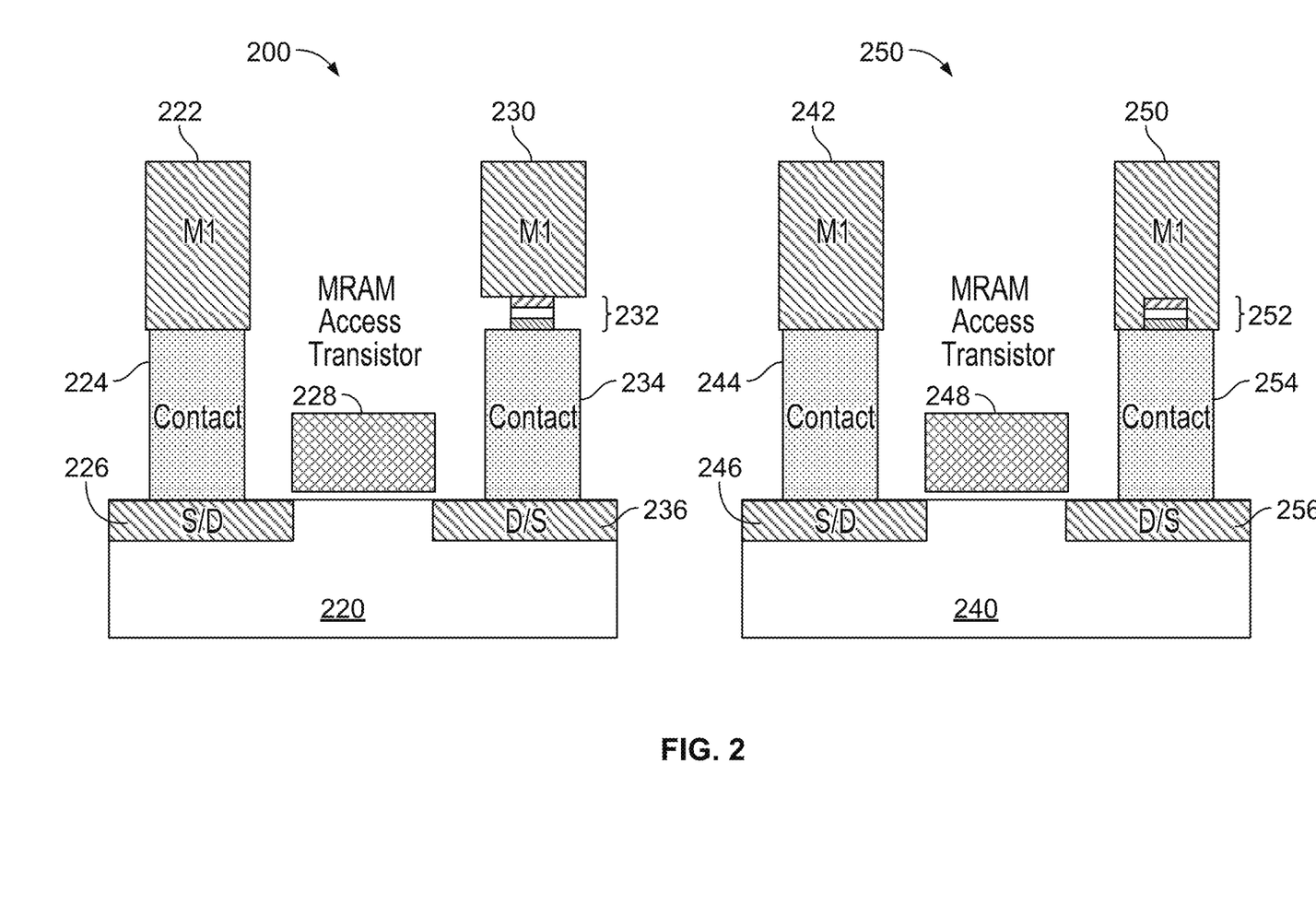
FIG. 2 is a diagram of an illustrative view of a desired structure and a problematic structure, in accordance with an embodiment of the present disclosure.

FIG. 2 shows an illustrative view of a desired structure 200 and a problematic structure 250, in accordance with some embodiments of the present disclosure.
The desired structure 200 includes an MRAM access transistor 228, two M1 lines 222 and 230, two contacts 224 and 234, a source/drain (S/D) contact 226, a drain/source (D/S) contact 236, and a substrate 220. In the desired structure 200, the magnetic tunneling junction 232 is positioned between the M1 line 230 and the contact 234, thereby fully separating the M1 line 230 from the contact 234.

The problematic structure 250 illustrates a yield problem in manufacturing MRAM devices. The problematic structure 250 is similar to the desired structure 200 in that the problematic structure 250 includes an MRAM access transistor 248, two M1 lines 242 and 250, two contacts 244 and 254, an S/D contact 246, a D/S contact 256, and a substrate 240. One difference between the problematic structure 250 and the desired structure 200 is that the magnetic tunneling junction 252 in the problematic structure is enveloped by the M1 line 250 on 3 sides and does not separate the M1 line 250 from the contact 254. One reason why the M1 line 250 envelops the magnetic tunneling junction 252 on three sides may be due to limitations associated with the trench that is created to form the M1 line 250. The resulting contact between the M1 line 250 and the contact 254 may cause the magnetic tunneling junction 252 to become shorted, which is undesirable. When a structure like the problematic structure 250 is formed, the cell malfunctions and fails to create a yielding device.

Figure 3:
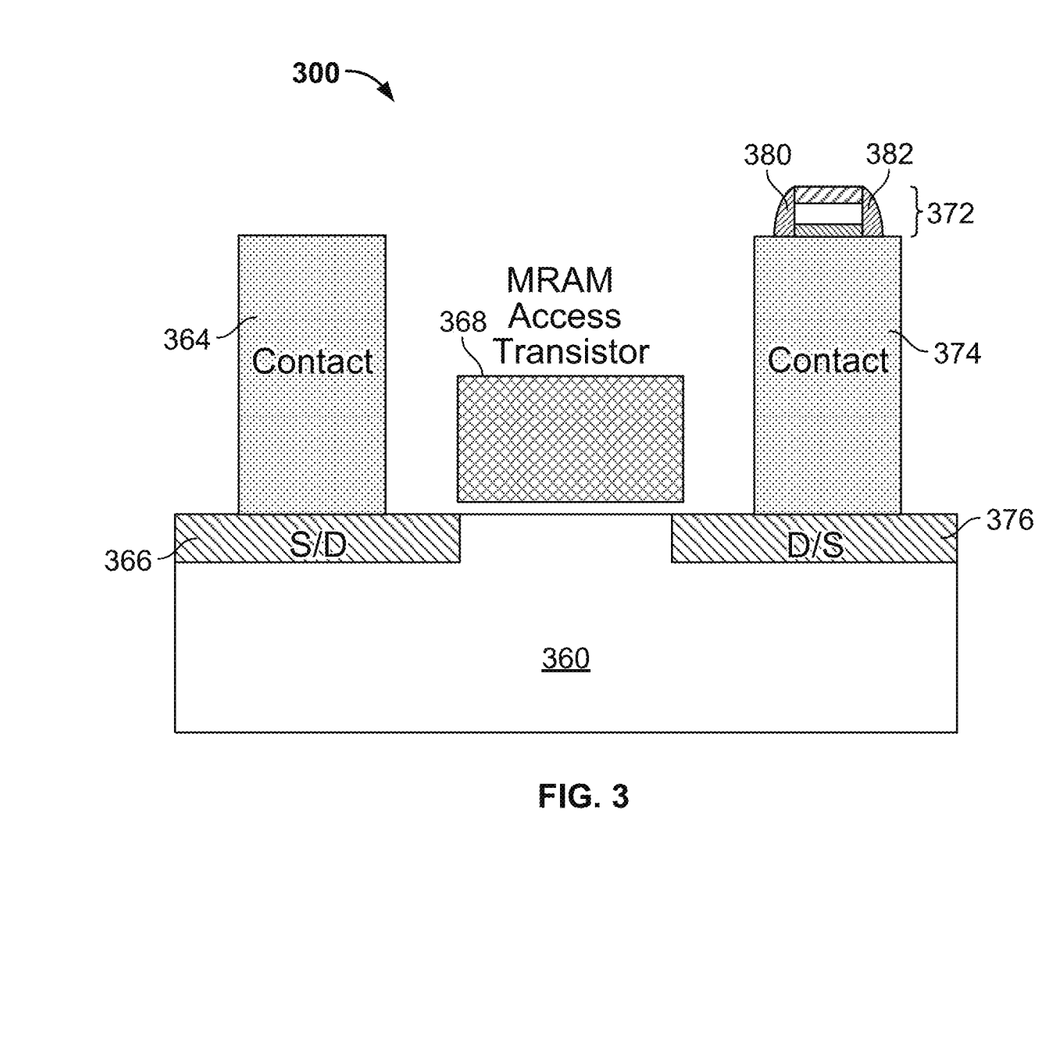
FIG. 3 is a diagram of an illustrative view of an improved structure having spacers on either side of a magnetic tunneling junction, in accordance with an embodiment of the present disclosure.

FIG. 3 shows an illustrative view of an improved structure 300 having spacers 380 and 382 on either side of the magnetic tunneling junction 372, in accordance with some embodiments of the present disclosure. The improved structure 300 is similar to the desired structure 200 and the problematic structure 250 depicted in FIG. 2 in that the improved structure 300 includes many similar components. These include an MRAM access transistor 368, two contacts 364 and 374, an S/D contact 366, a D/S contact 376, and a substrate 360. The improved structure 300 depicts a cross section of a device, but one of ordinary skill in the art will understand that a spacer material (shown in FIG. 3 as spacers 380 and 382) surrounds the magnetic tunneling junction 372 (except on the top and bottom surfaces) and forms a single body of material.

The improved structure 300 also includes a magnetic tunneling junction 372 that is flanked on the left side by a first spacer 380 and is flanked on the right side by a second spacer 382. The spacers 380 and 382 are positioned on either side of the magnetic tunneling junction 372 and may include a dielectric material that has good etch selectivity compared to the M1 (not shown) dielectric material that is positioned above the magnetic tunneling junction 372. In an example, the M1 dielectric material may include silicon dioxide ($SiO_2$) while the spacers 380 and 382 material may include $Si_xN_y$, or silicon nitride $Si_3N_4$, which has good etch selectivity to $SiO_2$. In an example, the M1 dielectric material is a low-k material, meaning that it has a small dielectric constant relative to silicon dioxide, such as silicon oxide doped with carbon, or SiOC.

The M1 dielectric material has good etch selectivity compared to the spacer material 380 and 382. Good etch selectivity between two materials means that the two materials, when exposed to the same etching conditions, are etched at very different rates from each other. In this manner, a first material may be etched away while the etching process has a minimal effect (or no effect at all) on a second material. Under different etching conditions, the second material may be etched away while the etching process has minimal effect (or no effect at all) on the first material.

To manufacture the magnetic tunneling junction 372 with side spacers 380 and 382, the spacer material or film (e.g., silicon nitride) is deposited and is etched away. The deposition may be conformal (e.g., spacer material is deposited with a similar thickness along a length of the device), and the etching may be performed anisotropically (e.g., the spacer material is removed at the top and at the bottom, but not much is removed at the sidewalls, causing some spacer material to remain at the sidewalls of the magnetic tunneling junction 372). The anisotropic etch causes just the spacers 380 and 382 at the sidewalls of the magnetic tunneling junction 372 to remain.

Importantly, the spacers 380 and 382 protect the magnetic tunneling junction 372's fixed layer, which rests on top of the contact 374. Accordingly, each of the spacers 380 and 382 may have a triangular shape so as to have bottom portion (near the fixed layer) that is thicker than a top portion (near the storage layer). Because the M1 line will come into contact with the top surface of the magnetic tunneling junction 372's storage layer, there may be less of a need to protect the storage layer compared to the tunnel oxide layer and the fixed layer. In an example, if the M1 line comes into contact with the tunnel oxide layer of the magnetic tunneling junction 372 (but not the fixed layer), the magnetic tunneling junction 372 is not shorted, but the contact with the tunnel oxide layer affects the margins of the magnetic tunneling junction 372. Accordingly, it is desirable to only allow the M1 line to come into contact with the top surface of the storage layer of the magnetic tunneling junction 372.

As is shown in FIG. 3, the spacers 380 and 382 have a near triangular shape and resemble the sidewalls of a dome. However, in general, one of ordinary skill in the art will understand that the spacers 380 and 382 may have any shape, without departing from the scope of the present disclosure.

Figure 4:
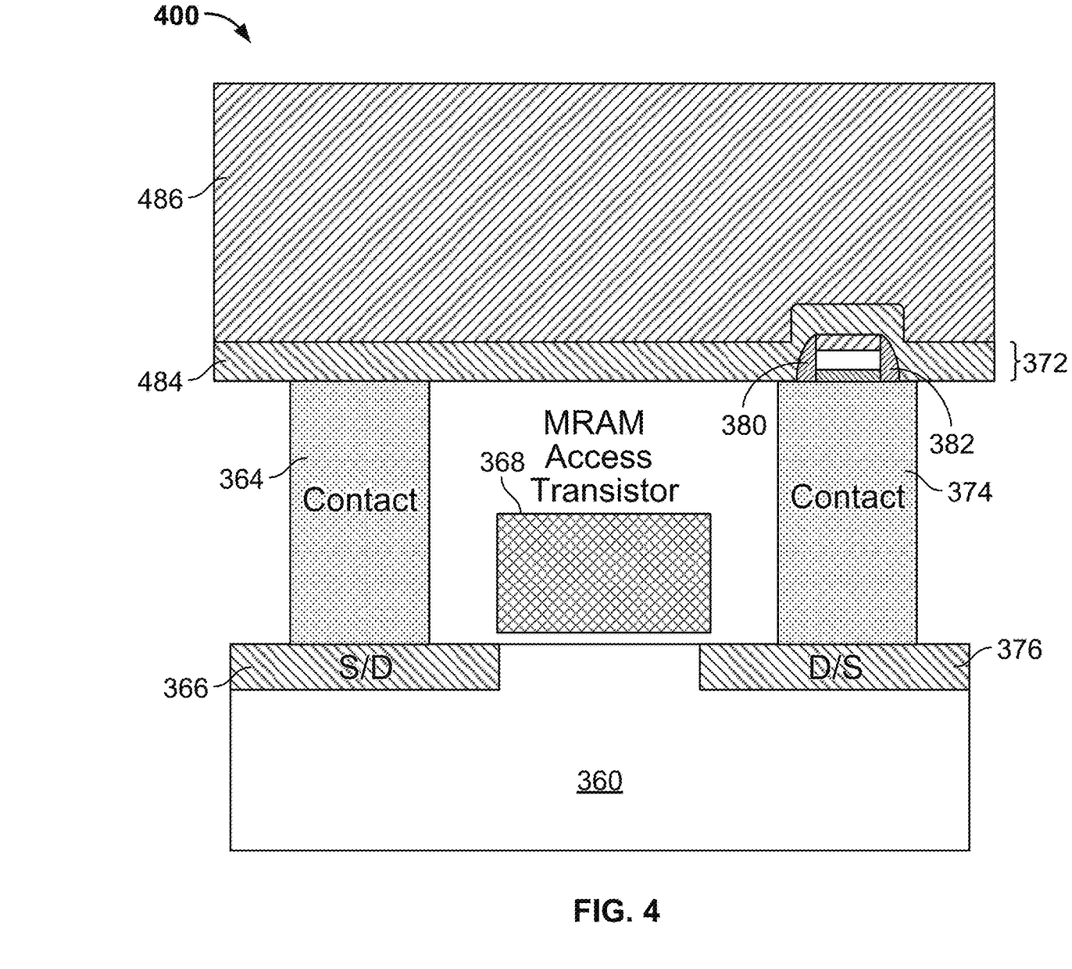
FIG. 4 is a diagram of an illustrative view of a further improved structure having a dielectric etch stop layer between M1 dielectric material and side spacers, in accordance with an embodiment of the present disclosure.

FIG. 4 shows an illustrative view of a further improved structure 400 having a dielectric etch stop layer between M1 dielectric material and side spacers, in accordance with some embodiments of the present disclosure. The structure 400 is similar to the structure 300 depicted in FIG. 3 in that the structure 400 includes many similar components, including an MRAM access transistor 368, two contacts 364 and 374, an S/D contact 366, a D/S contact 376, a substrate 360, and a magnetic tunneling junction 372 flanked on either side by spacers 380 and 382.

The structure 400 further includes a dielectric etch stop layer 484 that may be deposited before the M1 dielectric material 486 is deposited. In particular, the material of the dielectric etch stop layer 484 may be selected to have good etch selectivity compared to the M1 dielectric material 486 as well as the material in the spacers 380 and 382. In an example, the dielectric etch stop layer 484 may include material such as silicon carbon nitride (SiCN). In particular, SiCN has good etch selectivity compared with $SiO_2$ or low-k material, which may be used as a material in the M1 dielectric 486. Moreover, SiCN also has good etch selectivity compared with $Si_xN_y$, or silicon nitride, which may be used in the spacers 380 and 382. By ensuring that the material in the dielectric etch stop layer 484 has good etch selectivity compared to the materials used in the M1 dielectric 486 as well as the spacers 380 and 382, a reliable contact is created between the M1 material and the top surface of the magnetic tunneling junction 372 without shorting to the bottom surface of the magnetic tunneling junction 372.

Furthermore, as is described in more detail below, the structure 400 takes advantage of a loading effect that occurs due to the small three-dimensional geometry of the device. The loading effect occurs because the etch stop layer material 484 is deposited in the presence of sidewalls that are spaced closely together. The loading effect changes the boundary conditions of the etching process, and causes the etch rate of the etch stop layer material 484 to be different in the presence of the closely spaced sidewalls.

While FIG. 4 depicts only a single dielectric stop layer 484, one of ordinary skill in the art will understand that multiple dielectric stop layers having the same or different materials may be used, without departing from the scope of the present disclosure.

FIGS. 5-8 show an illustrative series of four diagrams 500, 600, 700, and 800 at four different points of a manufacturing process that results in a device having a protected magnetic tunneling junction, in accordance with some embodiments of the present disclosure. These depict an illustration of important MRAM structures with process integration steps to improve MRAM manufacturability.

Figure 5:
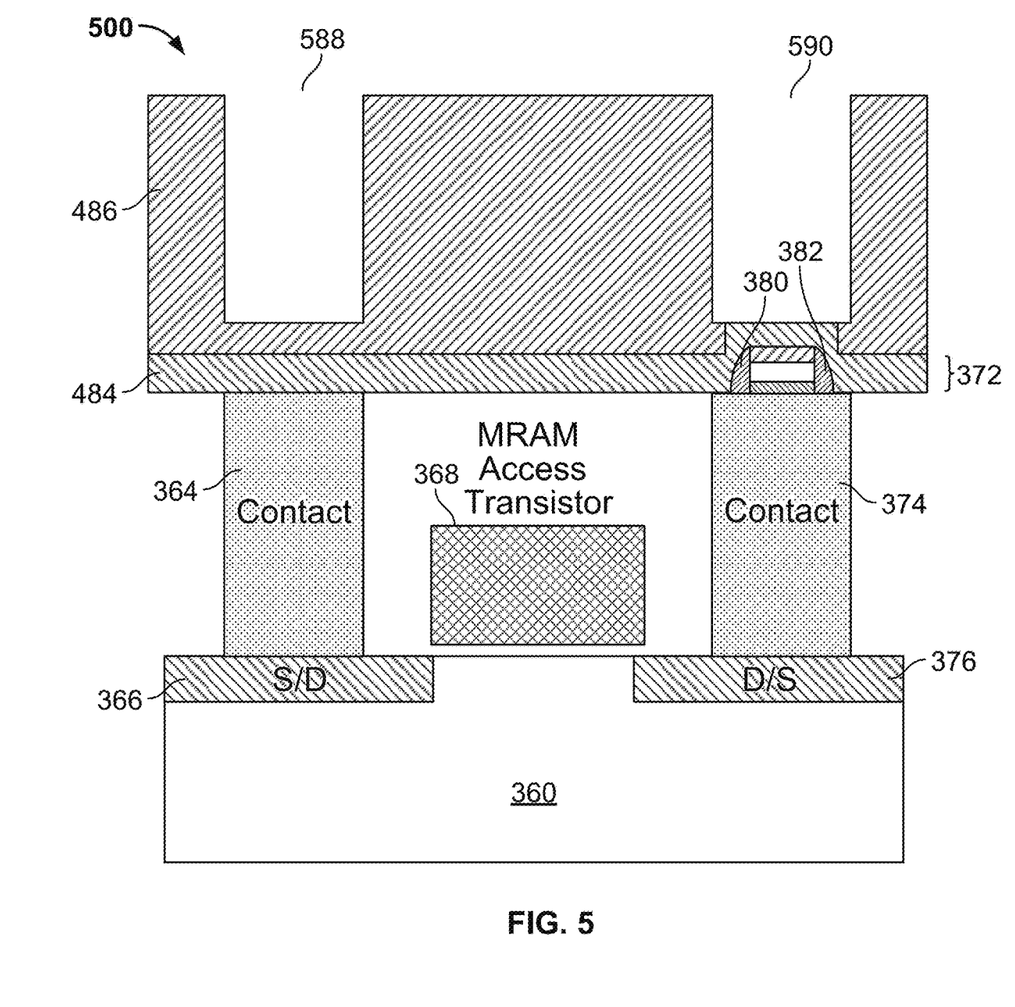
FIGS. 5-8 are an illustrative series of diagrams at four different points of a manufacturing process that results in a device having a protected magnetic tunneling junction, in accordance with an embodiment of the present disclosure.

In a first step, as is shown in the first diagram 500, two trenches 588 and 590 of the M1 dielectric material 486 are etched so as to reach a top surface of the etch stop layer 484 above the magnetic tunneling junction 372. In particular, because the magnetic tunneling junction 372 is positioned above the D/S contact 376 but not above the S/D contact 366, the trench 590 reaches the top of the etch stop layer 484, while a portion of the etch stop layer 484 still remains below the trench 588.

Figure 6:
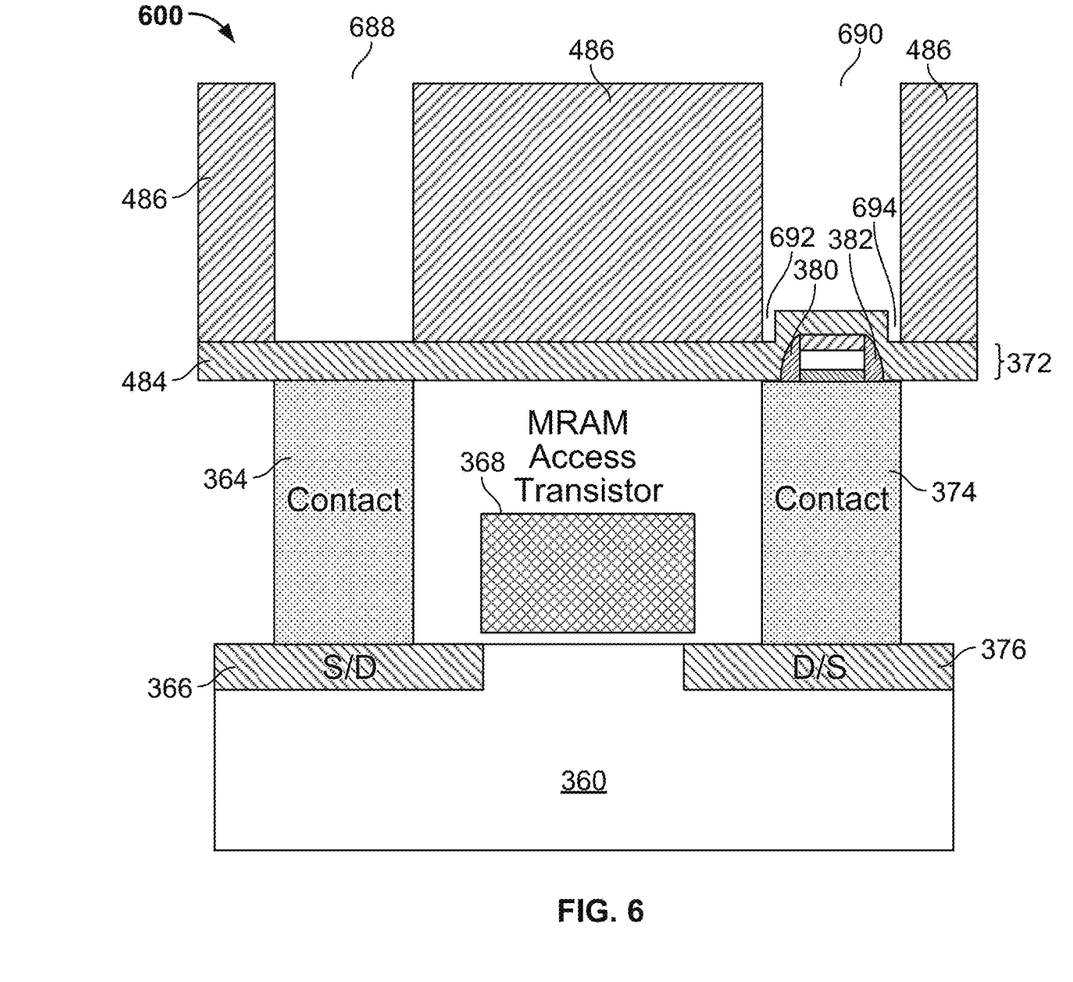

In a second step depicted in the second diagram 600, the remaining portion of the etch stop layer 484 that remains below the trench 588 is etched away. To do so, the same M1 etch chemistry as was used in the first step (depicted in FIG. 5) is used. This chemistry has good selectivity to the etch stop layer, such that the M1 dielectric material 486 is etched with minimal or no etching of the etch stop dielectric 484 itself. As is shown in FIG. 6, the trench 688 is etched until the top surface of the etch stop layer 484 is reached. Moreover, the trench 690 is etched past the top-most surface of the etch stop layer 484, removing additional M1 dielectric material 486 and creating trenches 692 and 694.

Figure 7:
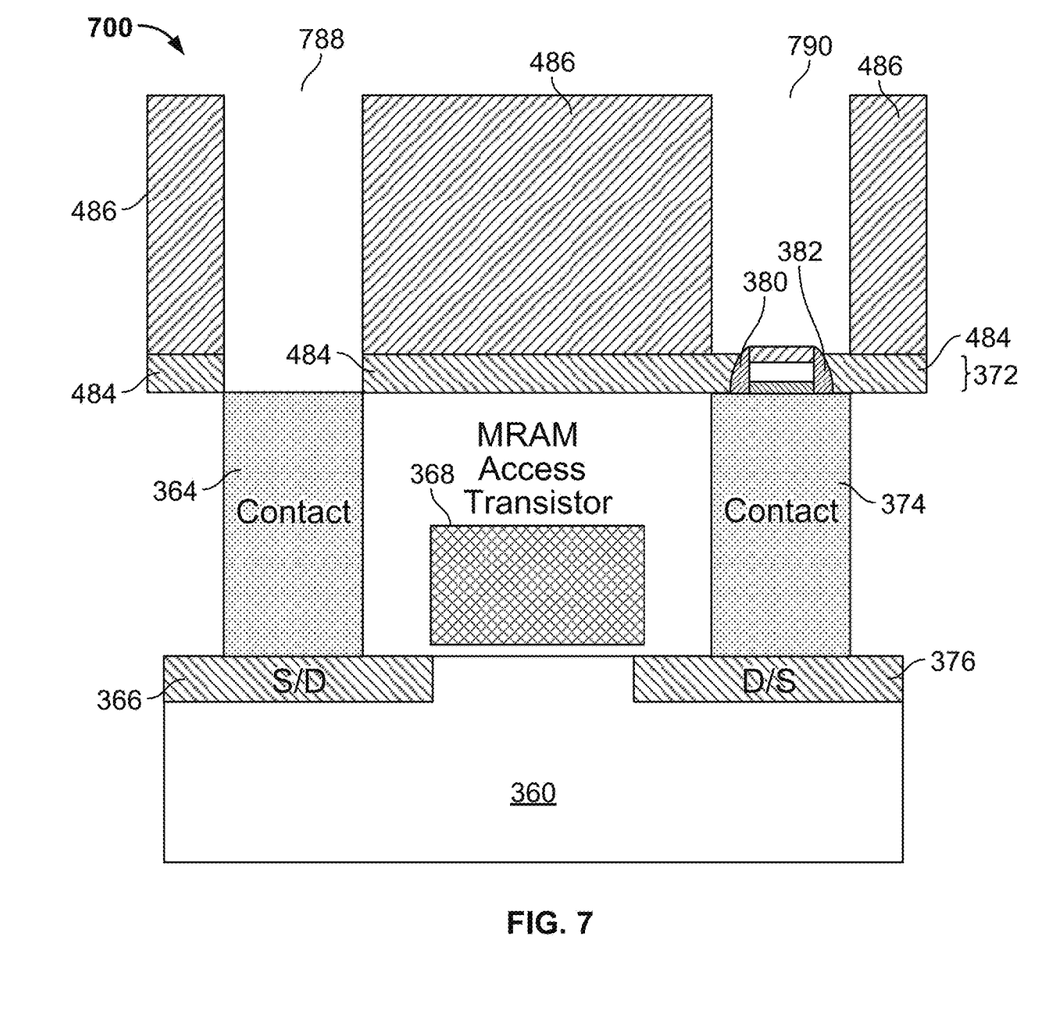

In a third step depicted in the third diagram 700, the etching chemistry is switched from selectively etching the M1 dielectric material 486 to selectively etching the etch stop layer 484. In doing so, the portion of the etch stop layer 484 below the trench 788 is removed, such that the trench 788 has contact with the contact 364.

Similarly, a top portion of the etch stop layer 484 (previously shown as positioned above the magnetic tunneling junction 372 in FIG. 6) is removed until the trench 790 has contact with the top surface of the magnetic tunneling junction 372. Because the material of the etch stop layer 484 has good selectivity to the material of the spacers 380 and 382, the spacers 380 and 382 are not etched or removed during this step. Moreover, the small geometry of the device results in a loading effect, causing a portion of the etch stop layer 484 between the outer sidewalls of the spacers 380 and 382 and the inner sidewalls of the trench 790 to largely remain after the etching is complete in the third step. Advantageously, the loading effect means that very little (or none) of the etch stop layer material 484 between the outer sidewalls of the spacers 380 and 382 and the inner sidewalls of the trench 790 is etched away when the etch stop layer 484 is etched in the third step.

Figure 8:
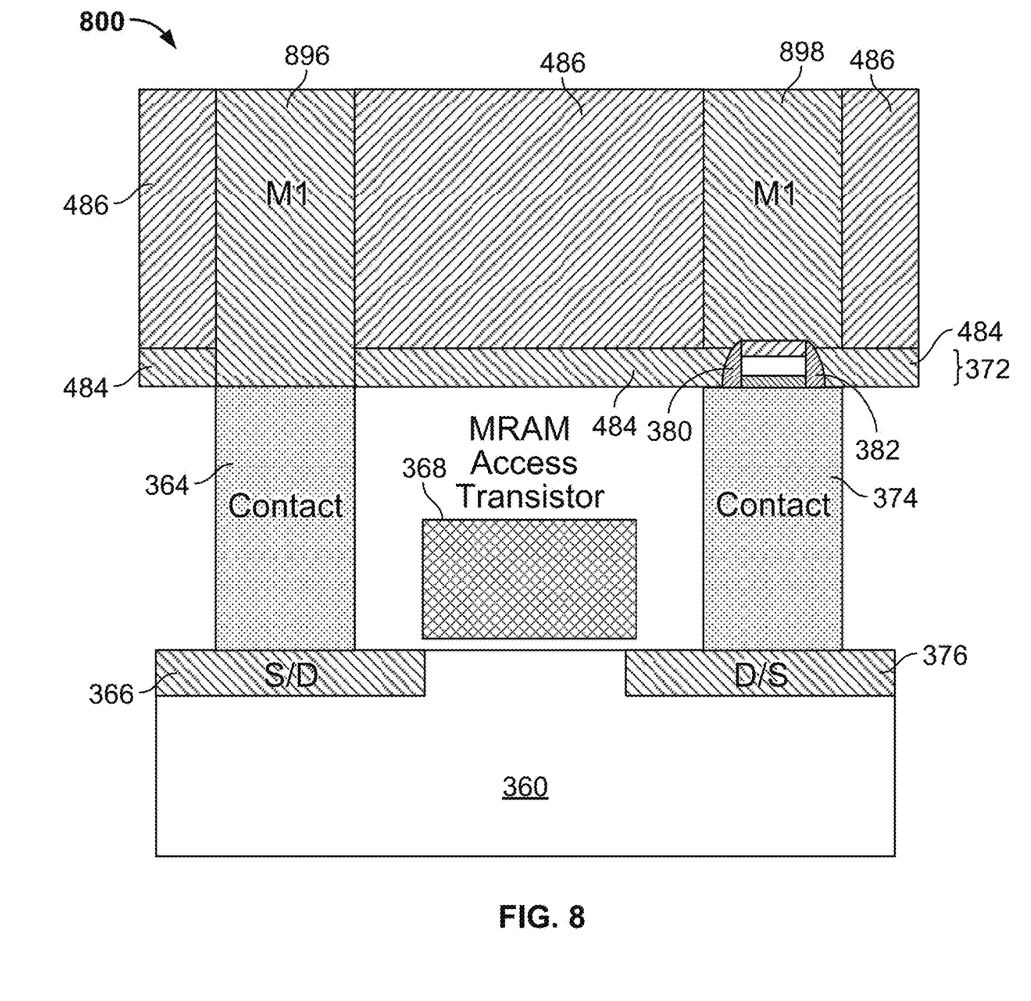

In a fourth step depicted in the fourth diagram 800, the metallization of the M1 material is completed. In particular, the trenches 788 and 790 of FIG. 7 are filled with a conductive metal material to create M1 lines 896 and 898. Moreover, the remaining steps of MRAM chip fabrication are completed (not shown).

As is shown in FIG. 8, the resulting device's M1 line 898 contacts just the top surface of the magnetic tunneling junction 372, due to the presence of the spacers 380 and 382. For additional protection, etch stop layer material 484 is positioned between the spacers 380 and 382 and the M1 line 898, to further ensure that the magnetic tunneling junction 372 is not shorted (e.g., to ensure that the M1 line 898 does not have direct contact with the contact 372, as is shown in the example diagram 250). Advantageously, the resulting device in FIG. 8 has two layers of material (the spacers 380 and 382 and the etch stop layer material 484) that protect the magnetic tunneling junction 372 from being shorted.

As was described above, it is important to protect at least the fixed layer of the magnetic tunneling junction 372, meaning that the M1 line 898 should not be allowed to contact the fixed layer of the magnetic tunneling junction 372. Accordingly, the height of the spacers 380 and 382 and/or the height of the etch stop layer material 484 should be at least as high as the fixed layer (bottom layer of the magnetic tunneling junction 372) and preferably at least as high as the tunnel oxide layer (middle layer of the magnetic tunneling junction 372).

Figure 9:
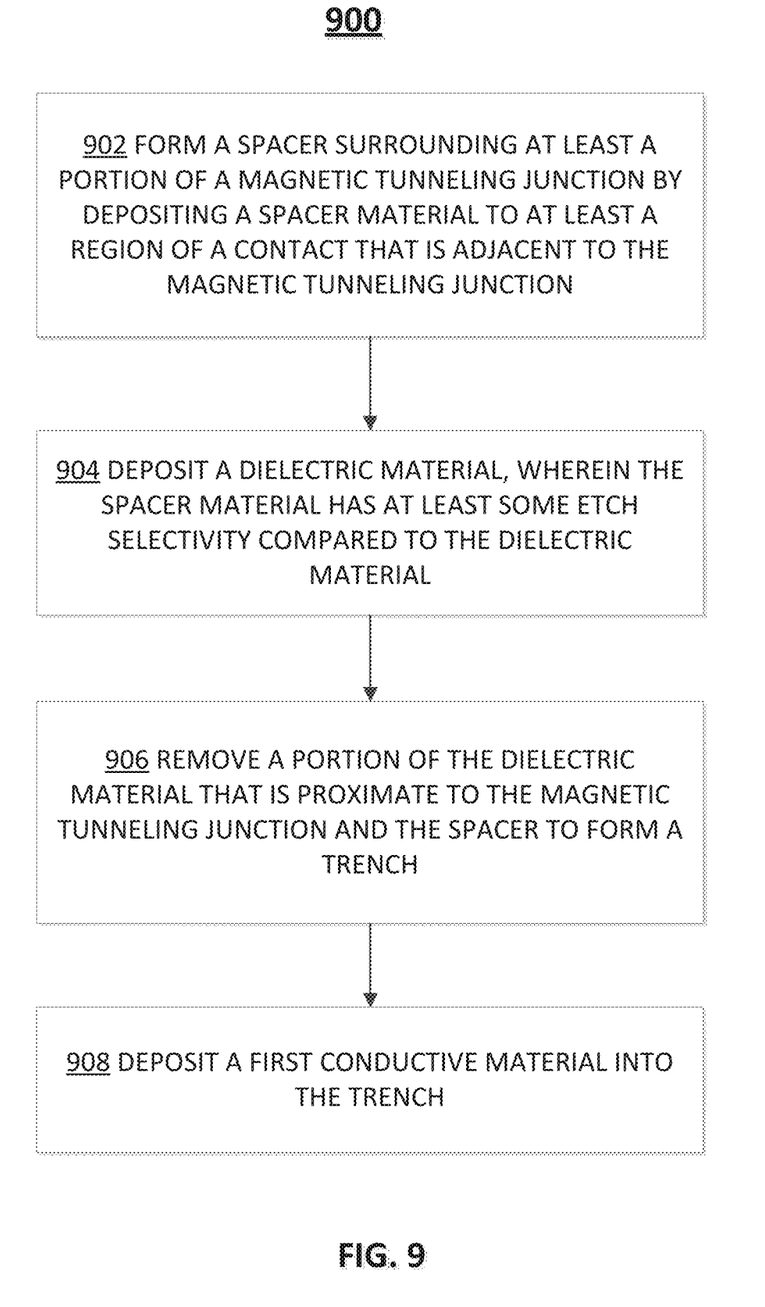
FIG. 9 is a high level flow chart for a process for manufacturing a semiconductor device, in accordance with an embodiment of the present disclosure.

FIG. 9 shows a high level flow chart for a process 900 for manufacturing a semiconductor device, in accordance with an embodiment of the present disclosure.

At 902, the process 900 includes forming a spacer surrounding at least a portion of a magnetic tunneling junction by depositing a spacer material to at least a region of a contact that is adjacent to the magnetic tunneling junction. In some embodiments, the contact may be the contact 374 depicted in FIGS. 3-8, the magnetic tunneling junction may be the magnetic tunneling junction 372 depicted in FIGS. 3-8, and the spacer may include the spacers 380 and 382 depicted in FIGS. 3-8. As was described in relation to FIGS. 3-8, the spacers 380 and 382 may be formed to surround the sidewalls of the magnetic tunneling junction 372. The spacers 380 and 382 may be formed by depositing spacer material to a region of the contact 374 that is near the magnetic tunneling junction 372.

In some embodiments, a first portion of the spacer material that is proximate to a fixed layer of the magnetic tunneling junction is thicker than a second portion of the spacer that is proximate to a storage layer of the magnetic tunneling junction. As was described above, the formation of the spacer material may include a conformal deposition, followed by an anisotropic etching. This may cause the spacers 380 and 382 at the sidewalls of the magnetic tunneling junction 372 to remain, and causes the shape of the spacers 380 and 382 to be roughly triangular. Importantly, the spacers 380 and 382 protect the fixed layer of the magnetic tunneling junction 372, which rests on top of the contact 374. The triangular shape of the spacers 380 and 382 means that the spacer material is thicker on the bottom portion (near the fixed layer) and thinner on the top portion (near the storage layer). Because the M1 line will come into contact with the top surface of the storage layer of the magnetic tunneling junction 372, there may be less of a need to protect the storage layer compared to the tunnel oxide layer and the fixed layer.

At 904, a dielectric material is deposited, wherein the spacer material has at least some etch selectivity compared to the dielectric material. In some embodiments, the dielectric material deposited at 904 is the M1 dielectric material 486 shown in FIGS. 4-8. Optionally, the M1 dielectric material 486 may be deposited directly on the contacts 364 and 374, the magnetic tunneling junction 372, and the spacers 380 and 382, without the etch stop layer 484. In this case, no etch stop layer 484 is used, and the M1 dielectric material 486

Alternatively, the M1 dielectric material 486 may be deposited on an etch stop layer 484, which is deposited after forming the spacer (902) and before depositing the dielectric material (904). The etch stop material may include silicon carbon nitride, and has some etch selectivity compared to the dielectric material (which may include silicon dioxide) as well as some etch selectivity compared to the spacer material (which may include silicon nitride). As was described above, a loading effect due to the small geometry of the device may cause a portion of the etch stop material that is adjacent to the spacer to remain after a portion of the etch stop material is removed. In particular, as was described in relation to FIG. 7, a portion of the etch stop layer 484 between the outer sidewalls of the spacers 380 and 382 and the inner sidewalls of the trench 790 largely remains after the etching of the etch stop layer 484 is complete.

At 906, a portion of the dielectric material that is proximate to the magnetic tunneling junction and the spacer is removed to form a trench. At 908, a first conductive material is deposited into the trench. In some embodiments, the first conductive material corresponds to the M1 conductive material 896 and 898 shown and described in relation to FIG. 8. As was described in relation to the fourth diagram 800, the metallization of the M1 material is completed by filling the trenches 788 and 790 with a conductive metal material to create M1 lines 896 and 898.

While various embodiments of the present disclosure have been shown and described herein, it will be obvious to those skilled in the art that such embodiments are provided by way of example only. Numerous variations, changes, and substitutions will now occur to those skilled in the art without departing from the disclosure. It should be understood that various alternatives to the embodiments of the disclosure described herein may be employed in practicing the disclosure. It is intended that the following claims define the scope of the disclosure and that methods and structures within the scope of these claims and their equivalents be covered thereby.

What is claimed is:

1. A method of manufacturing a semiconductor device, the method comprising:
    forming a spacer surrounding at least a portion of a magnetic tunneling junction by depositing a spacer material to at least a region of a contact that is adjacent to the magnetic tunneling junction;
    after forming the spacer, depositing an etch stop material onto the spacer and the magnetic tunneling junction to directly contact an upper surface of a storage layer of the magnetic tunneling junction;
    depositing a dielectric material directly onto the etch stop material, wherein the spacer material has at least some etch selectivity compared to the dielectric material;
    removing a portion of the dielectric material that is proximate to the magnetic tunneling junction and the spacer to form a trench; and
    depositing a first conductive material into the trench.

2. The method of claim 1, wherein a loading effect causes a first portion of the etch stop material that is adjacent to the spacer to remain after a second portion of the etch stop material is removed.

3. The method of claim 1, wherein the etch stop material has at least some etch selectivity compared to the dielectric material and at least some etch selectivity compared to the spacer material.

4. The method of claim 3, wherein the etch stop material comprises silicon carbon nitride.

5. The method of claim 1, wherein the dielectric material comprises silicon dioxide, and the spacer material comprises silicon nitride.

6. The method of claim 1, wherein the spacer surrounds portions of sidewalls of the magnetic tunneling junction.

7. The method of claim 1, wherein a first portion of the spacer that is proximate to a fixed layer of the magnetic tunneling junction is thicker than a second portion of the spacer that is proximate to the storage layer of the magnetic tunneling junction.

8. The method of claim 7, wherein, after depositing the first conductive material into the trench, a surface of the storage layer contacts the first conductive material.

9. The method of claim 7, wherein a surface of the fixed layer contacts the contact.

* * * * *